United States Patent
Li et al.

(10) Patent No.: US 6,559,052 B2
(45) Date of Patent: May 6, 2003

(54) DEPOSITION OF AMORPHOUS SILICON FILMS BY HIGH DENSITY PLASMA HDP-CVD AT LOW TEMPERATURES

(75) Inventors: Zhuang Li, San Jose, CA (US); Kent Rossman, San Jose, CA (US); Tzuyuan Yiin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/893,350

(22) Filed: Jun. 26, 2001

(65) Prior Publication Data

US 2002/0037635 A1 Mar. 28, 2002

Related U.S. Application Data (60) Provisional application No. 60/216,865, filed on Jul. 7, 2000.

(51) Int. Cl.[7] .................................................. H01L 21/44
(52) U.S. Cl. .......................... 438/680; 438/72; 438/627; 438/789; 438/622; 438/482; 257/637; 257/640
(58) Field of Search ........................... 438/680, 72, 627, 438/789, 622, 482; 257/637, 640

(56) References Cited

U.S. PATENT DOCUMENTS

| | | | |
|---|---|---|---|
| 4,254,161 A | 3/1981 | Kemlage | 427/94 |
| 4,634,601 A | 1/1987 | Hamakawa et al. | 427/39 |
| 5,031,571 A * | 7/1991 | Igarashi et al. | 118/723 E |
| 5,238,866 A | 8/1993 | Boltz et al. | 437/100 |
| 5,562,952 A * | 10/1996 | Nakahigashi et al. | 118/50 |
| 5,571,576 A | 11/1996 | Qian et al. | 427/574 |
| 5,589,233 A | 12/1996 | Law et al. | 427/579 |
| 5,604,152 A | 2/1997 | Chen et al. | 437/101 |
| 5,643,823 A | 7/1997 | Ho et al. | 437/67 |
| 5,800,878 A | 9/1998 | Yao | 427/573 |
| 5,804,259 A | 9/1998 | Robles | 427/577 |
| 5,830,332 A | 11/1998 | Babich et al. | 204/192.15 |
| 5,837,331 A | 11/1998 | Menu et al. | 427/569 |
| 5,843,225 A * | 12/1998 | Takayama et al. | 117/8 |
| 5,930,657 A | 7/1999 | Kim et al. | 438/482 |
| 5,951,773 A | 9/1999 | Jang et al. | 118/723 R |
| 6,020,458 A | 2/2000 | Lee et al. | 528/401 |
| 6,033,979 A | 3/2000 | Endo | 438/622 |
| 6,043,167 A | 3/2000 | Lee et al. | 438/789 |
| 6,046,494 A | 4/2000 | Brigham et al. | 257/640 |
| 6,083,344 A * | 7/2000 | Hanawa et al. | 156/345.28 |
| 6,170,428 B1 * | 1/2001 | Redeker et al. | 118/715 |
| 6,184,158 B1 * | 2/2001 | Shufflebotham et al. | 438/788 |
| 6,184,572 B1 | 2/2001 | Mountsier et al. | 257/637 |
| 6,211,065 B1 | 4/2001 | Xi et al. | 438/627 |
| 6,214,637 B1 | 4/2001 | Kim et al. | 438/72 |

OTHER PUBLICATIONS

U.S. patent application Ser. No. 09/590,322, Fairbairn et al., filed Jun. 8, 2000.
U.S. patent application Ser. No. 09/339,888, Khazeni et al., filed Jun. 25, 1999.
U.S. patent application Ser. No. 09/245,438, Cheng et al., filed Feb. 5, 1999.
Robles et al., "Characterization Of High Density Plasma Chemical Vapor Deposited aα–Carbon And aα–Fluorinated Carbon Films For Ultra Low Dielectric Applications", Feb. 10–11, 1997 DUMIC Conference, 1997 ISMIC, pp. 26–33.

* cited by examiner

*Primary Examiner*—Matthew Smith
*Assistant Examiner*—V. Yevsikov
(74) *Attorney, Agent, or Firm*—Moser, Patterson & Sheridan (57) ABSTRACT

Method and apparatus for depositing an amorphous silicon film on a substrate using a high density plasma chemical vapor deposition (HDP-CVD) technique is provided. The method generally comprises positioning a substrate in a processing chamber, introducing an inert gas into the processing chamber, introducing a silicon source gas into the processing chamber generating a high density plasma, and depositing the amorphous silicon film. The amorphous silicon film is deposited at a substrate temperature 500° C. or less. The amorphous silicon film may then be annealed to improve film properties.

29 Claims, 7 Drawing Sheets

DEPOSITION OF AMORPHOUS SILICON FILMS BY HIGH DENSITY PLASMA HDP-CVD AT LOW TEMPERATURES

CROSS-REFERENCE TO RELATED APPLICATIONS

This application claims priority to U.S. provisional patent application serial No. 60/216,865, filed Jul. 7, 2000, which is herein incorporated by reference.

BACKGROUND OF THE INVENTION

1. Field of the Invention

The invention relates to the fabrication of integrated circuits and to the deposition of an amorphous silicon film by a chemical vapor deposition technique.

2. Background Of the Related Art

Semiconductor device geometries have dramatically decreased in size since such devices were first introduced several decades ago. Since then, integrated circuits have generally followed the two year/half-size rule (often called Moore's Law), that means that the number of devices on a chip doubles every two years. Today's fabrication plants are routinely producing devices having 0.35$\mu$m and even 0.18 $\mu$m feature sizes, and tomorrow's plants soon will be producing devices having even smaller geometries. As the feature size decreases, the thickness of deposited materials, such as dielectrics, remain substantially constant, with the result that the aspect ratios for the features, i.e., their height divided by width, increases. Many traditional deposition processes have difficulty filling sub-micron structures where the aspect ratio exceeds 4:1, and particularly where the aspect ratio exceeds 10:1.

Chemical vapor deposition (CVD) appears to be the most promising approach to deposit materials conformally within high aspect features. Integration of CVD films in semiconductor manufacturing is well-characterized and fairly simple to implement as compared to wet processes such as spin-on methods. The potential of using commercially available CVD equipment and simple manufacturing methodology makes CVD materials attractive from both an integration and an economic standpoint.

One material that can be deposited by CVD techniques is amorphous silicon. Amorphous silicon layers are used in the formation of gate electrodes in transistors, metal-silicon Schottky diodes, and as electrodes for capacitors in dynamic random-access memory (DRAM) integrated circuits. Amorphous silicon layers have conventionally been deposited with limited success by conventional chemical vapor deposition techniques.

For example, in one conventional method, atmospheric pressure chemical vapor deposition (APCVD), the deposition process is often carried out at temperatures greater than 650° C., and often more than 1000° C. These high processing temperatures can exceed the thermal budgets of the materials used in manufacturing processes and result in inter-layer diffusion and material decomposition. As such, high processing temperatures can limit the incorporation of the APCVD deposition process in the manufacturing of some semi-conductor devices. A further problem with the high deposition temperatures of APCVD processes is that materials deposited on the substrate surface, such as amorphous silicon, may form grains or crystals of variable sizes and orientations that result in films having variable uniformity and less than desirable film properties. Post deposition annealing processes of films with the variable sized and orientated grains and crystals typically do not improve crystal uniformity or improve film properties.

Other techniques, such as low pressure chemical vapor deposition (LPCVD) can be used to deposit amorphous silicon films at lower processing temperatures than APCVD, i.e., a deposition temperature lower than about 650° C. However, LPCVD methods often produce non-uniform amorphous silicon films having undesirable film characteristics such as high film resistivity and non-uniformity, which limit the use of the film in some semi-conductor manufacturing applications, such as in the formation of sub-micron semi-conductor diodes. Additionally, annealing processes for the LPCVD deposited films typically have not been successful in improving film characteristics for these films. Further, the deposition temperatures of such processes can still exceed the thermal budgets of the materials used for manufacturing semi-conductor devices and limit the use of LPCVD methods from use in some manufacturing processes.

Other LPCVD processes which may be used to deposit amorphous silicon films, such as disclosed in U.S. Pat. No. 5,604,152, require the precursor gas to be partially dissociated in an attached autoclave prior to entering the deposition chamber. This pre-deposition disassociation adds undesirable mechanical and procedural complexity to the deposition process and still requires the films to be deposited at high temperatures (i.e., greater than 500° C.). Furthermore, LPCVD processes are typically performed by a thermal decomposition mechanism of silicon precursors at relatively low deposition rates compared to other amorphous silicon deposition processes. The low deposition rates result in increased processing times, increased processing costs, and reduced substrate throughput.

Therefore, there exists a need for a process which deposits high quality amorphous silicon layers at reduced processing temperatures.

SUMMARY OF THE INVENTION

Aspects of the invention provide for depositing an amorphous silicon film on a substrate using a high density plasma chemical vapor deposition (HDP-CVD) technique. In one aspect, a method is provided for forming an amorphous silicon film on a substrate including positioning the substrate on a support member into a processing chamber connected to a bias power source, introducing an inert gas into the processing chamber, introducing a silicon source gas into the processing chamber, and delivering a source power to the processing chamber sufficient to generate a high density plasma. The deposited amorphous silicon film may then be annealed to enhance film properties.

In another aspect, a method is provided for forming an amorphous silicon film on a substrate including positioning the substrate in a high density plasma chemical vapor deposition chamber, introducing an inert gas into the high density plasma chemical vapor deposition chamber, introducing a silicon source gas into the high density plasma chemical vapor deposition chamber, generating a high density plasma of the processing gas by applying an RF power between about 500 Watts and about 5000 Watts to each of first and second coils disposed adjacent the processing chamber, applying a bias power to the support member, and depositing the amorphous silicon film while maintaining the substrate at a temperature of about 500° C. or less.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will now be described below in reference to a high density plasma chemical vapor deposition chamber, such as an Ultima™ HDP-CVD Chamber available from Applied Materials, Inc. located in Santa Clara, Calif. High density plasma (HDP) chemical vapor deposition (CVD) processes use physical ion generation from inductively coupled plasmas to dissociate reactive chemical gases into highly reactive ionic species to enhance film deposition. The high reactivity of the released ionic species reduces the energy required for a chemical reaction to take place, thus allowing film deposition at temperatures less than required for conventional chemical vapor deposition processes. High density plasma is characterized as a plasma having about $1 \times 10^{11}$ ions/cm$^3$ or greater.

Figure 1A:
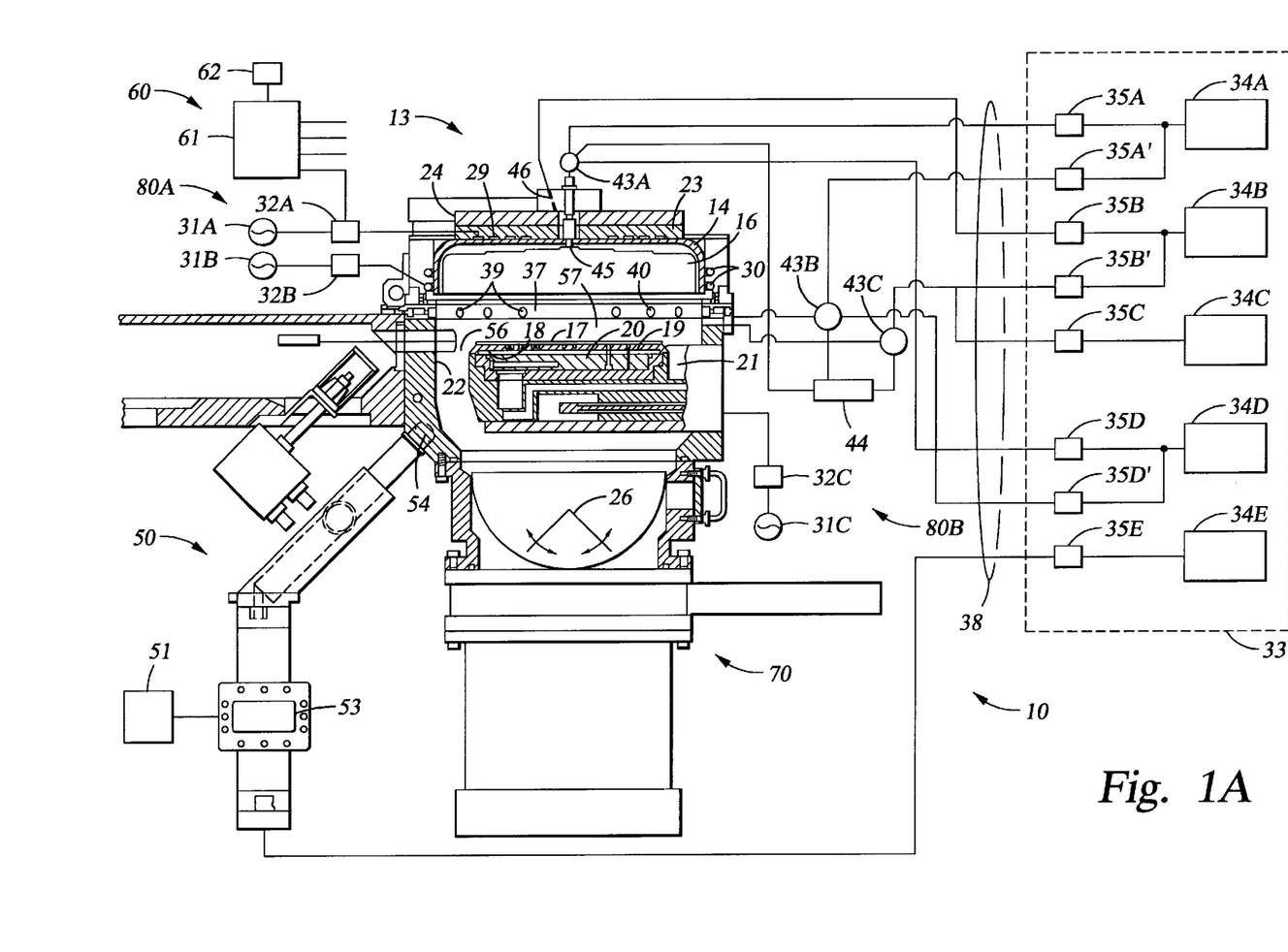
FIG. 1A is a simplified diagram of one embodiment of a high density plasma chemical vapor deposition (CVD) processing chamber useful for the invention described herein.

FIG. 1A illustrates one embodiment of a HDP-CVD system 10 useful for depositing a film according to embodiments of the invention described herein. The HDP-CVD system 10 includes a chamber 13, a vacuum system 70, a source power supply 80A, a bias power supply 80B, a gas delivery system 33, and a remote plasma cleaning system 50.

The upper portion of chamber 13 incudes a dome 14 mounted on a body member 22. The dome is typically made of a dielectric material, such as alumina or aluminum nitride. The dome 14 defines an upper boundary of a plasma processing region 16. The plasma processing region 16 has a lower boundary defined by an upper surface of a substrate 17 positioned on a substrate support member 18. A heater plate 23 and a cold plate 24 are thermally coupled to the dome 14. The heater plate 23 and the cold plate 24 allow control of the dome temperature to within about ±10° C. over a range of about 50° C. to 200° C. to prevent unwanted deposition of the processing gas on the dome's inner surface.

The lower portion of chamber 13 includes the body member 22 connecting the chamber to the vacuum system 70. The vacuum system 70 is connected to the body member 22 through a throttle valve 26. A base portion 21 of substrate support member 18 is mounted on, and forms a continuous inner surface with, body member 22. Substrates are transferred into and out of chamber 13 when the substrate support member 18 is in a lower loading position. 56 as shown in FIG. 1A. Once deposited on a substrate receiving portion 19 of substrate support member 18, the substrate 17 and the substrate support member 18 can then moved to an upper processing position defined as the area 57 in FIG. 1A. The substrate receiving portion 19 incudes an electrostatic chuck 20 that secures the substrate to substrate support member 18 during processing.

The source power supply 80A includes a top coil 29 and side coil 30, mounted on dome 14. A symmetrical ground shield (not shown) is disposed between the top coil 29 and side coil 30 to reduce electrical coupling between the coils. The top coil 29 is powered by a top source RF (SRF) generator 31A, while the side coil 30 is powered by a side SRF generator 31B, allowing independent power levels and frequencies of operation for each coil. This dual coil system allows control of the radiation density in chamber 13, thereby improving plasma uniformity. In one embodiment, the top source RF generator 31A provides up to about 5,000 watts of RF power at nominally about 2 MHz and the side source RF generator 31B provides up to about 5,000 watts of RF power at nominally about 2 MHz. The operating frequencies of the top and side RF generators may be offset from the nominal operating frequency to improve plasma-generation efficiency.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a comatch, and effectively disable the RF control circuit from tuning the matching network, is to set the reflected power limit above any expected value of reflected power. This may help stabilize a plasma under some conditions by holding the matching network constant at its most recent condition.

A bias power supply 80B includes a bias RF (BRF) generator 31C and a bias matching network 32C. The bias power supply 80B capacitively charges the substrate 17 and the substrate support member 18 coupled to the substrate 19, which act as complimentary electrodes during the deposition process. The bias power supply 80B serves to enhance the transport of plasma species created by the source power supply 80A to the surface of the substrate. In one embodiment, a bias RF generator provides up to about 5,000 watts of RF power at about 13.56 MHz.

Figure 1B:
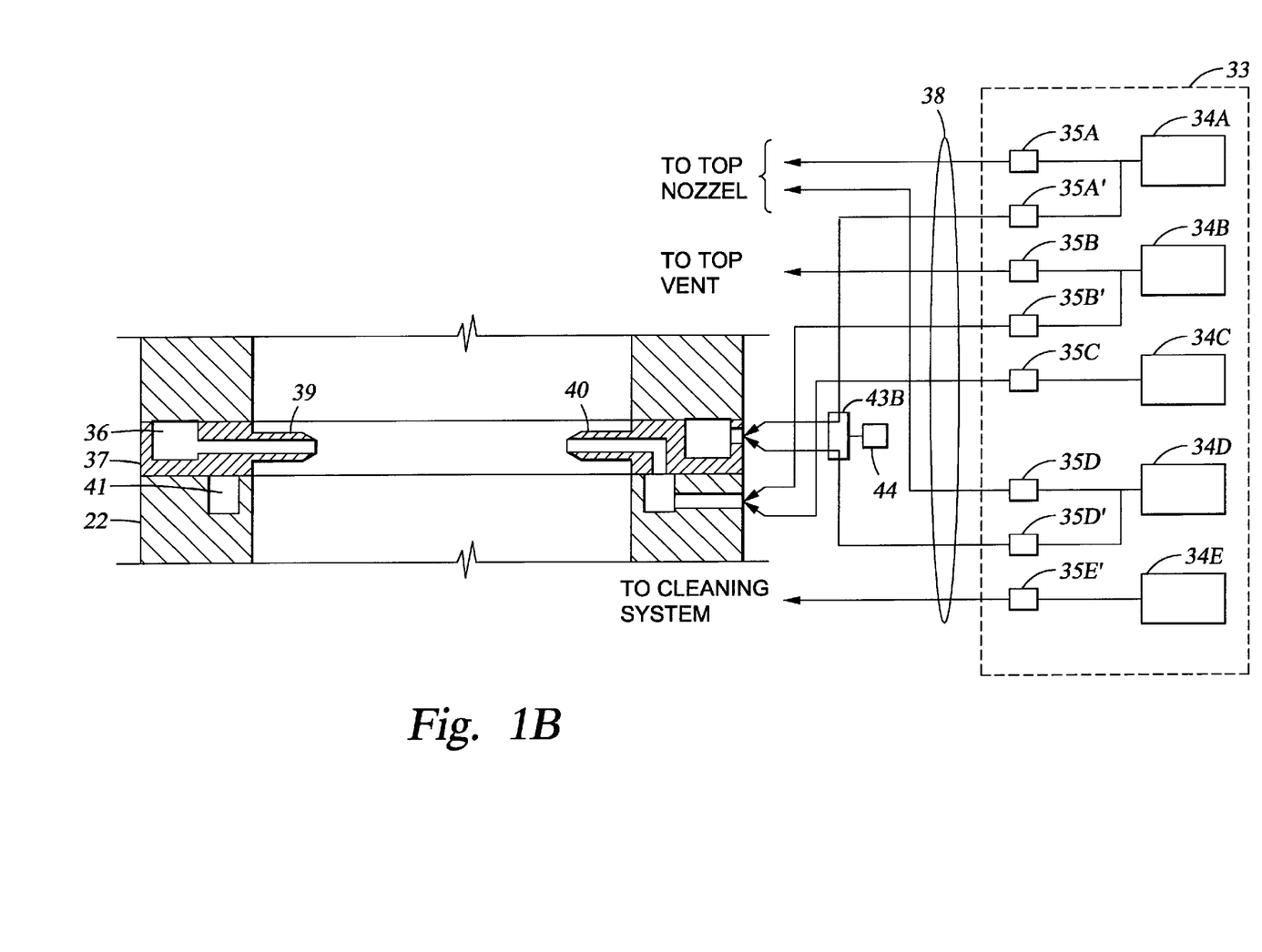
FIG. 1B is a simplified cross section of a gas ring that may be used in conjunction with the CVD processing chamber of FIG. 1A.

A gas delivery system 33 provides gases from several sources to the chamber for processing the substrate via gas delivery lines 38 (only some of which are shown). Gases are introduced into chamber 13 through a gas ring 37 and a top nozzle 45. FIG. 1B is a simplified, partial cross-sectional view of chamber 13 showing additional details of the gas ring 37. In one embodiment, first and second gas sources, 34A and 34D, and first and second gas mass flow controllers, 35A' and 35D', provide gas to a ring plenum 36 in gas ring 37 via gas delivery lines 38 (only some of which are shown). Gas ring 37 has a first plurality of source gas nozzles 39 (only one of which is shown in FIG. 1B), preferably evenly distributed along the inner surface of the gas ring 37, that provide a uniform flow of gas over the substrate during processing.

The gas ring 37 also includes a second plurality of gas nozzles 40 (only one of which is shown), which receive gas from a body plenum 41. In one embodiment, a third and a fourth gas source, 34B and 34C, and a third and a fourth gas flow controller, 35B' and 35C, provide gases to the body plenum 41 via gas delivery lines 38. In one embodiment, the second plurality of source gas nozzles 40 are co-planar with, and preferably shorter than the first plurality of source gas nozzles 39. In some embodiments, it is desirable not to mix source gases and oxidizer gases before injecting the gases into chamber 13. In other embodiments, the source gases may be mixed prior to injecting the gases into chamber 13.

The nozzle length and the nozzle angle may be changed to tailor the uniformity profile and gas utilization efficiency for a particular process within an individual chamber. In one embodiment, the gas ring 37 provides twelve source gas nozzles (preferably six nozzles 39 and six nozzles 40 in an alternating arrangement) evenly positioned around the inner circumference of the gas ring 37.

Referring again to FIG. 1A, chamber 13 also has top nozzle 45 and top vent 46. Top nozzle 45 and top vent 46 allow independent control of top and side flows of the gases. Top vent 46 is an annular opening around top nozzle 45. In one embodiment, a first gas source 34A supplies a first gas to source gas nozzles 39 and top nozzle 45. Source nozzle mass flow controller (MFC) 35A' controls the amount of the first gas delivered to source gas nozzles 39, and a top nozzle MFC 35A controls the amount of the first gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed before they flow into chamber 13. Separate sources of the same gas may be used to supply various portions of the chamber.

A system controller 60 controls the operation of system 10. In one embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus.

System controller 60 operates under the control of a computer program stored on the hard disk drive or other computer programs, such as programs stored on a floppy disk. The computer program dictates, for example, the timing, mixture of gases, RF power levels and other parameters of a particular process. System controller 60 includes a processor 61 coupled to a memory 62. In one embodiment, the memory 62 may be a hard disk drive, but of course memory 62 may be other kinds of memory, such as ROM, PROM, and others.

Figure 1C:
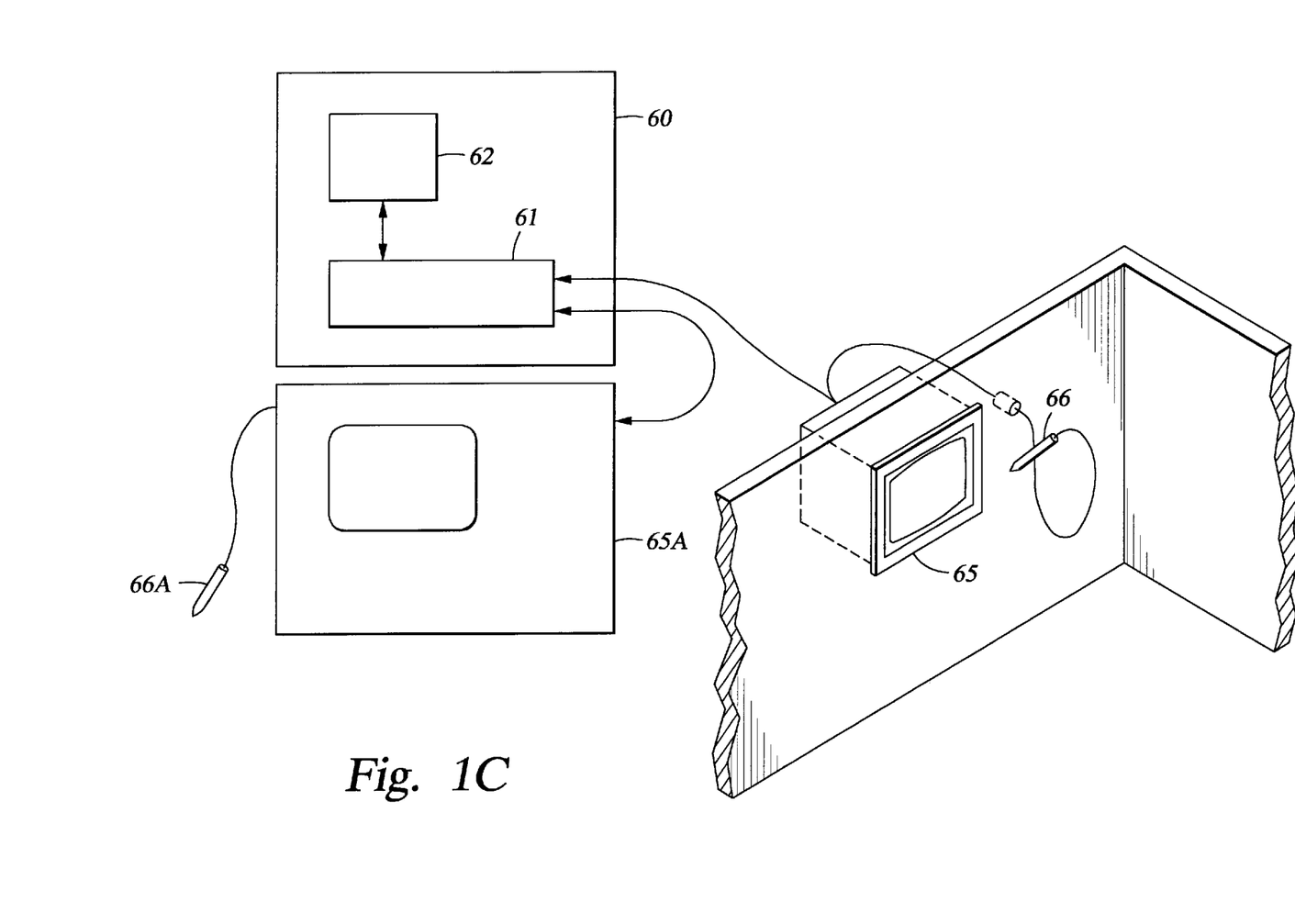
FIG. 1C is a simplified diagram of a monitor and light pen that may be used in conjunction with the CVD processing chamber of FIG. 1A.

The system controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 1C. In one embodiment, two monitors, 65 and 65A, are used, one mounted in the clean room wall for the operators and the other behind the wall for the service technicians. Both monitors simultaneously display the same information, but only one light pen (e.g., 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1D:
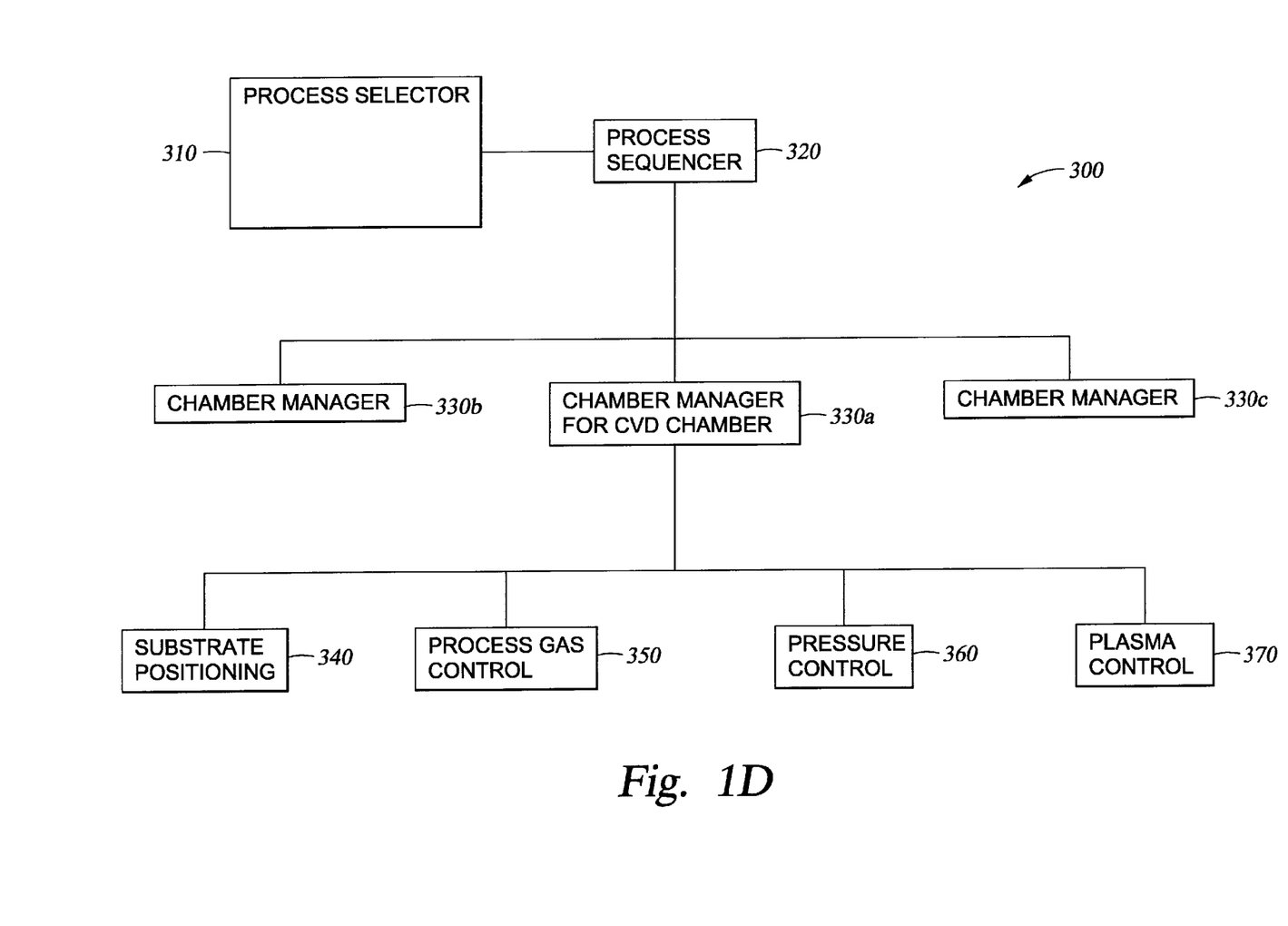
FIG. 1D is a flow chart of an exemplary process control computer program product used to control the CVD processing chamber of FIG. 1A.

FIG. 1D shows an illustrative block diagram of the hierarchical control structure of computer program 300. A user enters a process set number and process chamber number into a process selector subroutine 310 in response to menus or screens displayed on the CRT monitor by using the light pen interface. Tile process sets are predetermined sets of process parameters necessary to carry out specified processes, and are identified by predefined set numbers. Process selector subroutine 310 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence.

In one embodiment, sequencer subroutine 320 includes a program code to perform the steps of (i) monitoring the operation of the process chambers to determine if the chambers are being used, (ii) determining what processes are being carried out in the chambers being used, and (iii) executing the desired process; based on availability of a process chamber and type of process to be carried out. Conventional methods of monitoring the process chambers can be used, such as polling.

When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to tile process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with tile particular process set being executed.

Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multi-chamber system, after other processing has been completed.

Process gas control subroutine 350 has program code for controlling process gas composition and flow rates. Subroutine 350 controls the open/close position of the safety shutoff valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber before the above-described steps may then be carried out.

Furthermore, the process gas control subroutine 350 includes steps for obtaining the necessary delivery gas flow rate for the desired process gas flow rate by accessing a stored table containing the necessary values for a given process gas flow rate. Once the necessary values are obtained, the delivery gas flow rate is monitored, compared to the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the helium cools the substrate through the chuck, which may also be water-cooled. This keeps the substrate below a temperature that may damage preexisting features on the substrate.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer, for example, and the throttle valve 26 position may be adjusted according to pressure control subroutine 360, assuming the control point is within the boundaries set by gas flows and exhaust capacity. The former method may result in quicker chamber pressure changes, as the measurements, comparisons and calculations associated with the latter method are not invoked. The former method may be desirable where precise control of the chamber pressure is not required, whereas the latter method may be desirable where an accurate, repeatable, and stable pressure is desired, such as during the deposition of a film layer.

When pressure control subroutine 360 is invoked, the desired or target pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

While the above described HDP-CVD system is one system used for performing the invention described herein, other systems, may also be used, or can be modified to be used, to advantage to accomplish the methods of the invention.

The Deposition Process

Aspects of the invention will now be described with reference to a process sequence for depositing an amorphous silicon film using the above described processing system. In one embodiment of the deposition of an amorphous silicon film, a substrate is introduced into a processing chamber and positioned on a support member connected to a bias power source. A silicon source gas is introduced into the processing chamber. A plasma is formed by delivering a source power to the processing chamber sufficient to generate a plasma. A bias power is applied to the support member during the process. The amorphous silicon layer is then deposited on the substrate surface. Generally, the amorphous silicon material is deposited while maintaining the substrate temperature at about 500° C. or below. The deposited amorphous silicon film may then be annealed to enhance film properties.

An inert gas, such as helium, argon, xenon, krypton, and combinations thereof, is introduced into the processing chamber. Helium and argon are preferred inert gases for use in depositing the amorphous silicon film. The inert gas is introduced into the chamber through a set of gas nozzles 40 (as shown in FIG. 1A) at a flow rate of between about 0 sccm and about 200 sccm for a 200 mm substrate. Preferably, the inert gas is introduced into the processing chamber at between about 50 and about 150 sccm for a 200 mm substrate. However, The flow rate of the inert gas may vary depending upon the size of the processing chamber, i.e., 300 mm substrate processing chamber.

A silicon source gas, such as silane ($SiH_4$) or disilane ($Si_2H_6$), is introduced into the chamber through a set of gas nozzles 39 (as shown in FIG. 1A) at a flow rate of between about 20 sccm and about 100 sccm to deposit the amorphous silicon film in the presence of the plasma. Alternatively, the silicon source gas is introduced into the chamber at a flow rate between about 50 sccm and about 80 sccm to deposit the amorphous silicon film. The flow rate of the silicon gas may vary depending upon the size of the processing chamber, e.g., up to about 200 sccm for depositing films in a 300 mm substrate processing chamber. The silicon source gases may also include silane derivative gases that can deposit silicon films with little or no contaminants, such as carbon and nitrogen, either alone or in combination with silane, to deposit the amorphous silicon film.

Although the silicon source gas and the carrier gas are introduced into the chamber through separate gas nozzles, the invention also contemplates combining or premixing the silicon source gas and the carrier gas before introducing them into the chamber, or introducing the gases simultaneously or at different times. For example, the inert gas may be introduced into the processing chamber, a plasma is formed in the chamber, and then the silicon gas is introduced into the processing chamber to deposit the amorphous silicon film. Additionally, the amorphous silicon material may be deposited without the use of the inert gas under the method parameters described herein.

Generally, the processing chamber is maintained at a chamber pressure between about 1 milliTorr and about 50 milliTorr during the deposition process. A chamber pressure between about 2 milliTorr and about 20 milliTorr is preferably used. A chamber pressure between about 3 milliTorr and about 7 milliTorr may be used when depositing the amorphous silicon films.

Source RF power is supplied to each of the coils 29 and 30 disposed in the processing chamber at a power level of about 5000 watts (W) or less, or a total power of about 10000 watts or less, to generate a plasma in the processing chamber. The source RF power is supplied to each coil at a power level between about 500 watts and about 5000 watts for a 200 mm substrate to generate and maintain a plasma in the processing chamber. Preferably, a total power level between about 5000 watts and about 8500 watts, or even between about 6000 watts and about 8000 watts, may be used when depositing the amorphous silicon film.

Variable power may be applied to coils 29 and 30 depending upon the requirements of the operator. For example, a power level between about 4000 watts and about 5000 watts, e.g., 4500 watts, may be supplied to coil 29 and a power level between about 2000 watts and about 3000 watts, e.g., 2600 watts, may be supplied to coil 30 for generating a plasma and depositing the film.

Further, a negative bias may be applied to a substrate surface or support member to attract positively charged plasma ions produced in the plasma to the substrate surface at angles near the vertical to the surface, or at preferred angles to the surface by directional biasing of the substrate surface. Bias power of less than about 5000 watts may be supplied to the support member during the deposition process. A bias power of between about 0 Watts and about 1000 watts is preferably used in depositing the amorphous silicon film. The source RF power and bias powers supplied may be adjusted according to size of the substrate being processed and the type of chamber used.

The amorphous silicon films can be deposited on a substrate maintained at a temperature of about 500° C. or less, such as between about 250° C. and about 500° C. Alternatively, the substrate temperature is maintained at between about 300° C. to about 400° C. to deposit the amorphous silicon films. The substrate temperature can be maintained by cooling the backside of the substrate by flowing an inert gas in channels in the electrostatic chuck. The process described above can deposit amorphous silicon at a rate of between about 3000 Å and about 6000 Å per minute.

Following deposition of the amorphous silicon film, the substrate can be annealed to improve film properties. The substrate may be in situ annealed within the silicon deposition processing chamber or transferred to a separate processing chamber for annealing. An example of annealing the substrate is heating the substrate in a furnace to a temperature of between about 500° C. and about 1000° C. for a period of time between about 30 minutes and about 18 hours. Annealing the substrate at a temperature of about 1000° C. for between about 30 minutes and about one hour in an inert gas environment at about ambient pressure, i.e., about 760 Torr is preferably used to improve film properties.

In one embodiment, the amorphous silicon film can be deposited by introducing an argon gas into the chamber at a flow rate between about 0 sccm and about 100 sccm, maintaining the processing chamber at a pressure between about 1 milliTorr and about 50 milliTorr, supplying a source RF power between about 500 watts and about 5000 watts to the coil and a bias power between about 0 watts and about 1000 watts to the substrate support, maintaining the substrate at a temperature between about 300° C. and about 400° C., and introducing silane gas into the processing chamber at a flow rate of less than about 100 sccm.

Another example of the deposition process includes introducing silane into the chamber at a flow rate at about 85 sccm, maintaining the processing chamber at a pressure of about 5 milliTorr, supplying a source RF power of about 4500 watts to coil 29 and about 2600 watts to the coil 30, supplying power of about 1000 watts to the substrate support, and maintaining the substrate at a temperature at about 400° C. while depositing the amorphous silicon film.

It is believed that the use of a high density plasma chemical vapor deposition (HDP-CVD) process can deposit amorphous silicon films at temperature of less than 500° C., and in some embodiments at temperatures of less than 400° C. It is believed that the HDP-CVD process dissociates the processing gases by the application of radio frequency (RF) energy to the reaction zone proximate the substrate surface and reduces the energy required for a chemical reaction, such as decomposition of the silicon source gas, to occur. The reduction of the energy requirement for the chemical reaction to occur allows the deposition of amorphous silicon films at lower temperatures than can be achieved by conventional CVD processes.

It is further believed that the process for forming an amorphous silicon film by the processes described herein improves the electrical properties of the film by enhancing the formation of fine crystalline grains (i.e., grains of about 100 nm or less) in the deposited films. The formation of crystalline grains in a silicon film allows the film to become conductive with the ability to store energy. The ability to store quantities of energy allows silicon films to act as capacitors and diodes in sub-micron devices. Increasing the amount of crystalline grains in the film, particularly the number of fine crystalline grains, results in achieving a higher crystal density of the crystalline grains, thereby providing for greater energy storage and improving electrical performance, such as conductivity. It has been observed that the deposition of amorphous silicon films under high density plasma conditions and at substrate temperatures of 500° C. or less increases the amount of fine crystalline grains formed in the film.

It is contemplated that the deposition process increases the number of nucleation sites on a substrate as well as the randomness of the orientation of the crystals, resulting in a decrease of the average crystal size being formed on the film during the deposition process, thereby enhancing fine grain crystal formation. Further, the deposition temperatures are sufficiently low that the fine grains do not crystallize into large grain crystals, thereby enhancing the formation of a fine grain crystals. It is further contemplated that an increase in the amount of fine crystalline grains result in improved current flow as electrical resistance across grain boundaries is minimized with smaller grain boundaries, thereby reducing the film's resistivity. It is also believed that annealing can improve the desired electrical properties of the film by enhancing the formation of fine crystal grains in the film without an substantial increase in grain size.

EXAMPLES

The following data demonstrating the deposition of amorphous silicon films by the methods described herein was produced from an experiment conducted in an Ultima™ HDP-CVD Chamber available from Applied Materials, Inc. of Santa Clara, Calif. The amorphous silicon (HDP silicon) films were deposited on 6" crystalline n-type Si substrates to determine the suitability of HDP silicon for use as a material in a Schottky diode structure. A Schottky diode is formed at the point where a metal contacts a semi-conductor, preferably a doped semi-conductor, and is typically formed by depositing a metal layer on a silicon based material. An example of a Schottky diode is a titanium silicide ($TiSi_2$)-based Schottky diode structure formed at the interface of titanium and a silicon layer. The amorphous silicon layer and/or the substrate may be optionally implanted with a dopant material, for example, phosphorus to about an $1e^{17}$ atomic concentration, to enhance electrical properties of the layer or substrate for the fabrication of semi-conductor devices, such as Schottky diodes.

Schottky diodes utilizing amorphous silicon films were formed by depositing titanium on amorphous-silicon films. The amorphous silicon films were deposited by the reaction of silane under HDP-CVD plasma conditions on eight substrates according to the following procedure. 6" crystalline n-type Si substrates were each introduced into the HDP processing chamber and argon was then injected into the chamber at a flow rate of about 100 sccm. The chamber pressure during processing was maintained at about 5 milliTorr.

Substrates 1, 2, 4, and 6 were exposed to a plasma generated at a Source RF power of about 4500 watts (W) (i.e., High) at each coil, and substrates 3, 5, 7, and 8 were exposed to a plasma generated at a Source RF power of about 1500 watts (i.e., Low) at each coil. Substrates 1, 3, 5, and 7 were maintained at a temperature of about 300° C. (i.e., Low) and substrates 2, 5, 6, and 8 were maintained at a temperature of about 450° C. (i.e., High). Substrates 1, 2, 3, and 5 were exposed to a silane flow rate of about 100 sccm (i.e., High), and substrates 4, 6, 7, and 8 were exposed to a silane flow rate of about 40 sccm (i.e., Low) for substrates.

A summary of the RF Power, Temperature, and Flow rates for each substrate is listed in Table 1 below. The amorphous silicon was deposited using the above listed processing conditions for about 2 minutes at a deposition rate of between about 800 Å/min and about 5000 Å/min.

The substrates were then implanted with phosphorus to have an approximate $1e^{17}$ concentration of atoms per cubic centimeter. A titanium (Ti) layer was then deposited on the amorphous silicon layer to form the Schottky diode. A thin silicon cap layer was then deposited on the titanium layer to prevent oxygen or moisture contamination. The substrates were then patterned, etched, and cleaved into quadrants testing. Prior to testing, the substrates were annealed at about 600° C. for about 8 hours in a nitrogen environment having about ambient pressure. Following anneal, the Schottky diodes were then tested for diode performance by application of a voltage across contacts disposed on the substrate and at the Schottky interface. The results from the testing of the Schottky diodes is shown in FIGS. 2A–2C and 3A–3C.

TABLE 1

Substrate Processing Conditions

| Substrate # | $SiH_4$ Flow Rate (sccm) | RF Power (W) | Temperature (° C.) |
|---|---|---|---|
| 1 | High | High | Low |
| 2 | High | High | High |
| 3 | High | Low | Low |
| 4 | Low | High | Low |
| 5 | High | Low | High |
| 6 | Low | High | High |
| 7 | Low | Low | Low |
| 8 | Low | Low | High |

Figure 2A:
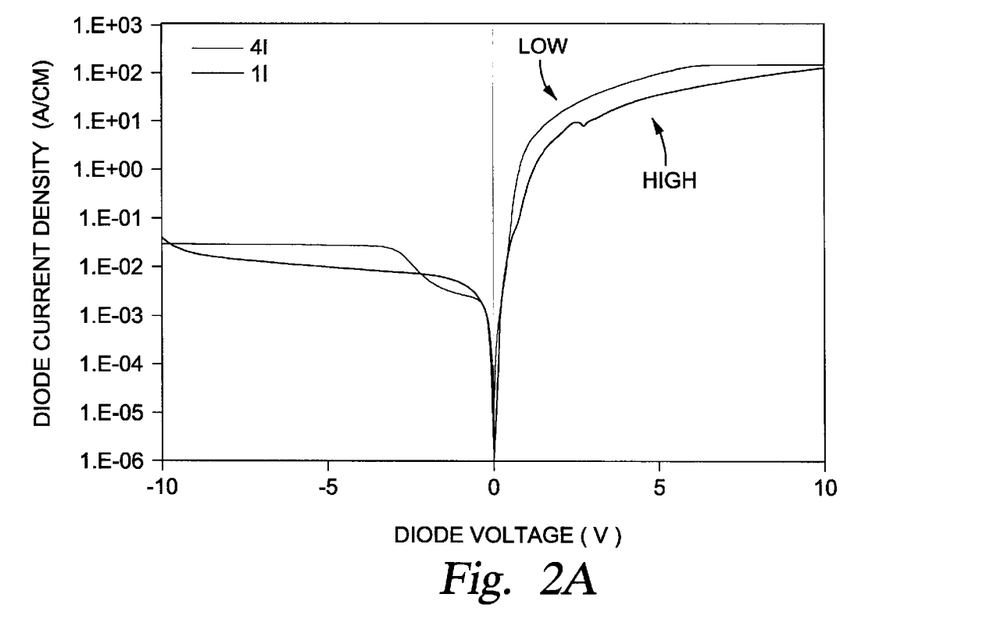
FIGS. 2A–2C are plots showing the diode current density of the silicon films deposited by the methods described herein at variable processing gas flows.

FIG. 2A shows a plot of diode current density at applied diode voltage for two amorphous silicon films deposited on substrates 1 and 4 respectively. The amorphous silicon films were deposited with High and Low silane flow rates at a constant High RF power and at a constant Low temperature. Improved diode performance is represented by a higher diode current density, which is an indication of the diode's ability to store and transfer energy. In FIG. 2A (and accompanying FIGS. 2B–2C), the horizontal axis is the voltage applied across the diode, from −10V to 10V, while the vertical axis indicates the relative diode current density of different films deposited at different flow rates. FIG. 2A indicates that the amorphous silicon film did perform as Schottky diodes and also indicated that lower silane flow rates appear to provide for improved diode current density at High RF power and Low temperature.

Figure 2B:
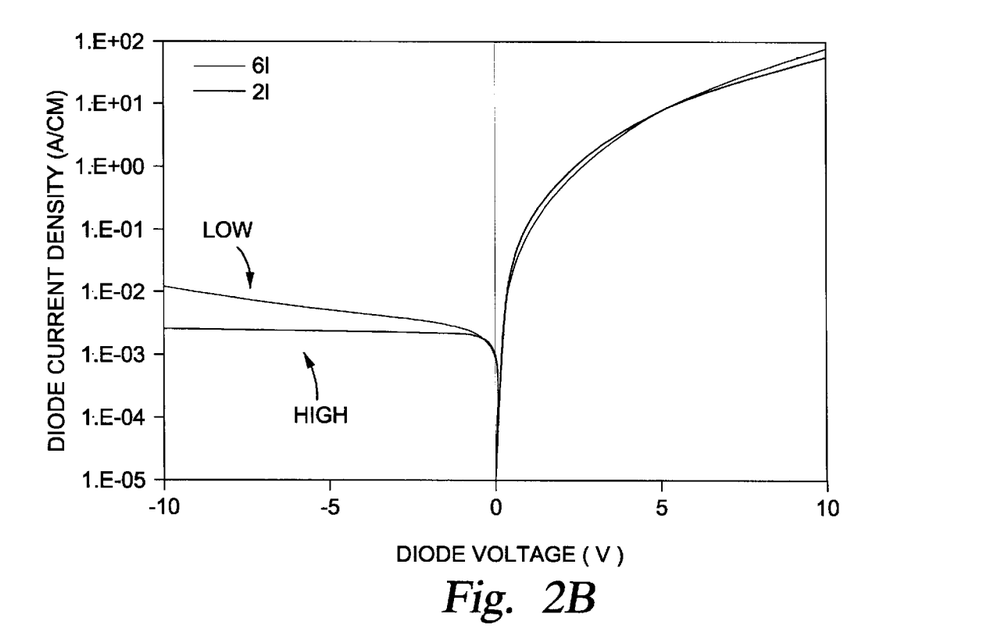

FIG. 2B shows a plot of diode current density at applied diode voltage for two of the amorphous silicon films deposited on of substrates 2 and 6 respectively. The amorphous silicon films were deposited with High and Low silane flow rates at a constant High RF power and at a constant High temperature. FIG. 2B indicates that lower silane flow rates appear to provide for improved diode current density at High RF power and Low temperature.

Figure 2C:
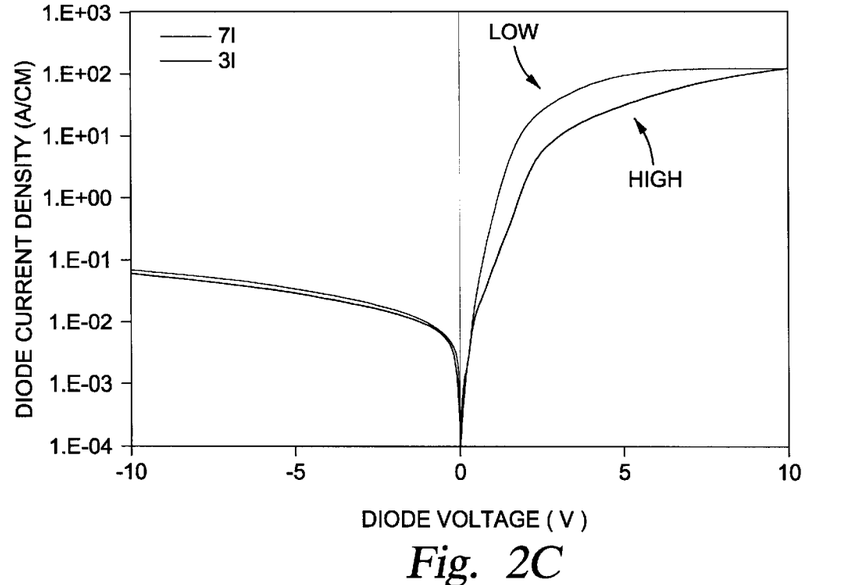

FIG. 2C shows a plot of diode current density at applied diode voltage for two of the amorphous silicon films deposited on of substrates 3 and 7 respectively. The amorphous silicon films were deposited with High and Low silane flow rates at a constant Low RF power and a Low temperature. FIG. 2B indicates that lower silane flow rates appear to provide for improved diode current density at Low RF power and Low temperature.

FIGS. 2A–2C show that the silane rates and power levels of the HDP process described herein result in sufficient amorphous silicon deposition at temperatures of about 450° C. or less. In addition, it is believed that the lower silane rates are believed to allow for a greater degree of fine grain crystallinity to be achieved in the film as evidenced by improved diode current density at lower flow rates. It is contemplated that lower flow rates result in lower deposition rates and limit the available material for growth at nucleation sites, while still providing sufficient material for forming nucleation sites, thereby increasing fine grain nucleation. The lower deposition rates further allow fine grain nucleation sites to sufficiently grow so that the fine grains assimilation into larger grains is minimized, thereby enhancing the formation of a fine grain crystals in the deposited film.

Figure 3A:
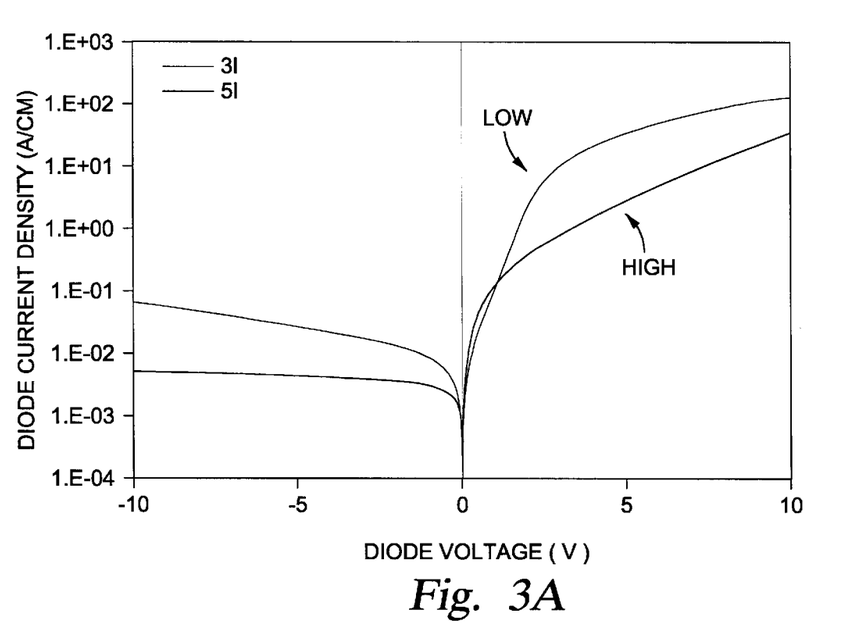
FIGS. 3A–3C are plots showing the diode current density of the silicon films deposited by the methods described herein at variable deposition temperatures.

FIG. 3A shows a plot of diode current density at applied diode voltage for two amorphous silicon films deposited on substrates 3 and 5 respectively. Improved diode performance is represented by a higher diode current density, which is an indication of the diode's ability to store and transfer energy. In FIG. 3A (and accompanying FIGS. 3B–3C), the horizontal axis is the voltage applied across the diode, from –10V to 10V, while the vertical axis indicates the relative diode current density of different films deposited at different temperatures. The amorphous silicon films were deposited with High and Low temperatures at a constant Low RF power and a High silane flow rate. FIG. 3A indicates that lower deposition temperatures provide for improved diode current density at Low RF power and High flow rate.

Figure 3B:
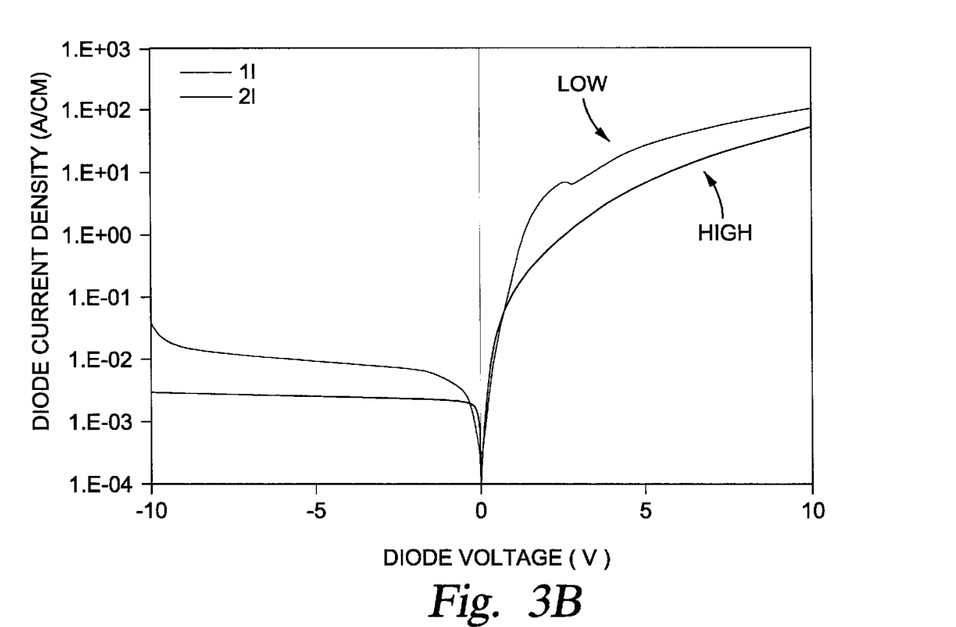

FIG. 3B shows a plot of diode current density at applied diode voltage for two amorphous silicon films deposited on substrates 1 and 2 respectively. The amorphous silicon films were deposited with High and Low temperatures at a constant High Flow rate and a High RF power. FIG. 3B indicates that lower deposition temperatures provide for improved diode current density at High RF power and High silane flow rate.

Figure 3C:
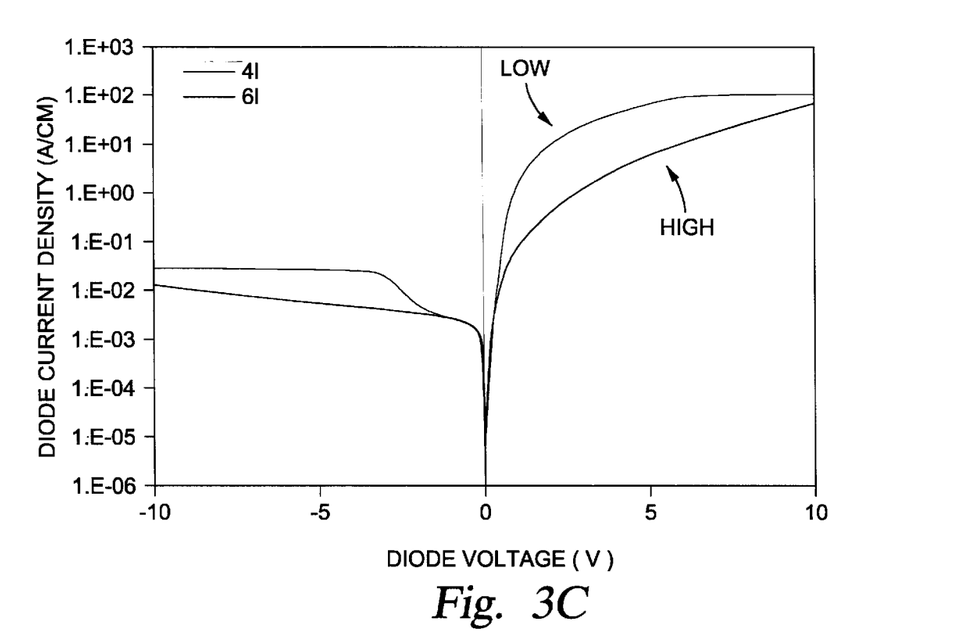

FIG. 3C shows a plot of diode current density at applied diode voltage for two amorphous silicon films deposited on substrates 4 and 6 respectively. The amorphous silicon films were deposited with High and Low temperatures at a constant Low Flow rate and a Low RF power. FIG. 3C indicates that lower deposition temperatures provide for improved diode current density at Low RF power and Low silane flow rate.

FIGS. 3A–3C show sufficient amorphous silicon deposition at temperatures of about 450° C. or less and at lower power levels by the HDP process described herein result. It is believed that lower temperature deposition of amorphous silicon provides sufficient nucleation to form fine grain crystals in the film, and at a sufficiently low temperature that the fine grains do not crystallize into large grain crystals, thereby favoring the formation of a fine grain crystals. It is further believed that the post deposition anneal process indicates that the anneal step improves crystalline formation while retaining a high crystal packing density as evidenced by the improved diode performance.

It is believed that the HDP process described herein can produce amorphous silicon films for fabrication process than at lower temperatures and lower material consumption rates, which can increase substrate throughput and reduce production costs by previous CVD deposition processes.

While foregoing is directed to one embodiment of the invention, other and further embodiments of the invention may be devised without departing from the basic scope thereof, and the scope thereof is determined by the claims that follow.

What is claimed is:

1. A method for forming an amorphous silicon film on a substrate, comprising:

positioning the substrate on a support member in a processing chamber connected to a bias power source;

introducing an inert gas into the processing chamber;

introducing a silicon source gas into the processing chamber; and delivering a source power sufficient to generate a high density plasma to first and second coils disposed adjacent the processing chamber.

2. The method of claim 1, wherein the substrate is maintained at a temperature between about 250° C. and about 500° C.

3. The method of claim 1, wherein the substrate is maintained at a temperature between about 300° C. and about 400° C.

4. The method of claim 1, wherein the processing chamber is maintained at a pressure between about 1 milliTorr and about 50 milliTorr.

5. The method of claim 1, wherein the silicon source gas is selected from the group of silane, disilane, and combinations thereof.

6. The method of claim 1, wherein the silicon source gas is introduced at a flow rate of about 100 sccm or less.

7. The method of claim 6, wherein the silicon source gas is introduced at a flow rate between about 50 sccm and about 80 sccm.

8. The method of claim 1, further comprising annealing the substrate after deposition.

9. The method of claim 8, wherein annealing the substrate comprises heating the substrate to a temperature between about 500° C. and about 1000° C. for at least about 30 minutes.

10. A method for forming an amorphous silicon film on a substrate, comprising:

positioning the substrate on a support member in a processing chamber connected to a bias power source;

introducing an inert gas into the processing chamber;

introducing a silicon source gas into the processing chamber; and delivering a source power to each of first and second coils disposed adjacent the processing chamber sufficient to generate a high density plasma, wherein the plasma is generated by applying an RF power between about 500 Watts and about 5000 Watts to each of the first and second coils disposed adjacent the processing chamber.

11. The method of claim 10, wherein the first coil is disposed on top of the chamber and the second coil is disposed on a side of the dome and the plasma is generated by applying an RF power between about 4000 Watts and about 5000 Watts to the first coil and applying an RF power between about 2000 and about 3000 Watts to the second coil.

12. The method of claim 10, wherein the substrate is maintained at a temperature between about 250° C. and about 500° C.

13. The method of claim 12, wherein the substrate is maintained at a temperature between about 300° C. and about 400° C.

14. The method of claim 10, further comprising annealing the substrate after deposition.

15. The method of claim 14, wherein annealing the substrate comprises heating the substrate to a temperature between about 500° C. and about 1000° C. for at least about 30 minutes.

16. A method for forming an amorphous silicon film on a substrate, comprising:

positioning the substrate on a support member in a processing chamber connected to a bias power source;

introducing an inert gas into the processing chamber at a flow rate of about 100 sccm or less;

introducing a silicon source gas selected from the group of silane, disilane, and combinations thereof, into the processing chamber at a flow rate of about 100 sccm or less;

maintaining the processing chamber at a pressure of about 50 milliTorr or less;

maintaining the substrate at a temperature between about 250° C. and about 500° C.;

generating a high density plasma in the processing chamber by supplying a RF power of about 5000 watts or less to each of first and second coils; and supplying a bias power of about 5000 Watts or less to the support member.

17. The method of claim 16, wherein the substrate is maintained at a temperature between about 300° C. and about 400° C.

18. The method of claim 16, further comprising annealing the substrate after deposition.

19. The method of claim 18, wherein annealing the substrate comprises heating the substrate to a temperature between about 500° C. and about 1000° C. for at least about 30 minutes.

20. A method for forming an amorphous silicon film on a substrate, comprising:

positioning the substrate on a support member in a high density plasma chemical vapor deposition chamber;

introducing an inert gas into the high density plasma chemical vapor deposition chamber;

introducing a silicon source gas into the high density plasma chemical vapor deposition chamber;

generating a high density plasma of the processing gas by applying an RF power between about 500 Watts and about 5000 Watts to each of first and second coils disposed adjacent the processing chamber;

applying a bias power to the support member; and depositing the amorphous silicon film while maintaining the substrate at a temperature of about 500° C. or less.

21. The method of claim 20, wherein the processing chamber is maintained at a pressure between about 1 milliTorr and about 50 milliTorr.

22. The method of claim 20, wherein the substrate is maintained at a temperature between about 300° C. and about 400° C.

23. The method of claim 20, wherein the first coil is disposed on top of the chamber and the second coil is disposed on a side of the dome and the plasma is generated by applying an RF power between about 4000 Watts and about 5000 Watts to the first coil and applying an RF power between about 2000 and about 3000 Watts to the second coil.

24. The method of claim 20, wherein the bias power is applied to the support member at about 5000 Watts or less.

25. The method of claim 24, wherein the bias power is applied to the support member between 0 Watts and about 1000 Watts.

26. The method of claim 20, wherein the amorphous silicon film is formed by introducing the inert gas into the processing chamber at a flow rate of about 100 sccm or less, introducing a silicon source gas selected from the group of silane, disilane, and combinations thereof, into the processing chamber at a flow rate of about 100 sccm or less maintaining the processing chamber at a pressure of about 50 milliTorr or less, maintaining the substrate at a temperature between about 250° C. and about 500° C., and supplying the bias power of about 5000 Watts or less to the support member.

27. The method of claim 20, wherein the silicon source gas is selected from the group of silane, disilane, and combinations thereof.

28. The method of claim 20, further comprising annealing the substrate after deposition.

29. The method of claim 28, wherein annealing the substrate comprises heating the substrate to a temperature between about 500° C. and about 1000° C. for at least about 30 minutes.

* * * * *

UNITED STATES PATENT AND TRADEMARK OFFICE
CERTIFICATE OF CORRECTION

PATENT NO. : 6,559,052 B2
DATED : May 6, 2003
INVENTOR(S) : Li et al.

It is certified that error appears in the above-identified patent and that said Letters Patent is hereby corrected as shown below:

Title page,
Item [56], OTHER PUBLICATIONS, please change "a$a$-Carbon And a$a$-Fluorinated" to -- $a$-Carbon And $a$-Fluorinated --.

Column 9,
Lines 30-31, please change "$(Si_{2H6})$" to -- $(Si_2H_6)$ --.

Column 12,
Line 36, please change "8 hours" to -- 18 hours --.

Signed and Sealed this

Twelfth Day of August, 2003

JAMES E. ROGAN
*Director of the United States Patent and Trademark Office*